(12) United States Patent
Tanomura et al.

(10) Patent No.: US 6,924,201 B2
(45) Date of Patent: Aug. 2, 2005

(54) HETEROJUNCTION BIPOLAR TRANSISTOR AND METHOD OF PRODUCING THE SAME

(75) Inventors: Masahiro Tanomura, Tokyo (JP); Hidenori Shimawaki, Tokyo (JP); Yosuke Miyoshi, Tokyo (JP); Fumio Harima, Tokyo (JP)

(73) Assignee: NEC Compound Semiconductor Devices, Ltd. (JP)

( * ) Notice: Subject to any disclaimer, the term of this patent is extended or adjusted under 35 U.S.C. 154(b) by 68 days.

(21) Appl. No.: 10/447,934

(22) Filed: May 29, 2003

(65) Prior Publication Data

US 2003/0218187 A1 Nov. 27, 2003

Related U.S. Application Data

(62) Division of application No. 10/011,514, filed on Dec. 3, 2001, now abandoned.

(30) Foreign Application Priority Data

Dec. 4, 2000 (JP) ........................................ 2000-369065

(51) Int. Cl.$^7$ ............................................ H01L 21/331
(52) U.S. Cl. ........................ 438/312; 438/317; 438/319; 438/320
(58) Field of Search ................................ 438/312, 317, 438/319, 320

(56) References Cited

U.S. PATENT DOCUMENTS

| | | | | |
|---|---|---|---|---|
| 5,106,766 A | * | 4/1992 | Lunardi et al. | 438/312 |
| 5,682,046 A | * | 10/1997 | Takahashi et al. | 257/198 |
| 6,403,991 B1 | * | 6/2002 | Kurokawa et al. | 257/197 |
| 6,406,965 B1 | * | 6/2002 | Lammert | 438/312 |
| 6,407,617 B1 | * | 6/2002 | Yanagihara et al. | 327/534 |

FOREIGN PATENT DOCUMENTS

| | | | | |
|---|---|---|---|---|
| JP | 5-136159 | * | 6/1993 | |
| JP | 10178021 | * | 6/1998 | |
| JP | 10-178021 | | 6/1998 | ......... H01L/21/331 |
| JP | 2000-124226 | * | 4/2000 | |

* cited by examiner

Primary Examiner—Trung Dang
(74) Attorney, Agent, or Firm—Hayes Soloway P.C.

(57) ABSTRACT

A heterojunction bipolar transistor of the present invention is produced from a wafer including a substrate and a collector layer of a first conductivity type, a base layer of a second conductivity type and an emitter layer of the first conductivity type sequentially laminated on the substrate in this order. First, the wafer is etched up to a preselected depth of the collector layer via a first photoresist, which is formed at a preselected position on the emitter layer, serving as a mask. Subsequently, the collector layer etched with at least the sidewalls of the base layer and collector layer, which are exposed by the first etching step, and a second photoresist covering part of the surface of the collector layer contiguous with the sidewalls serving as a mask.

24 Claims, 10 Drawing Sheets

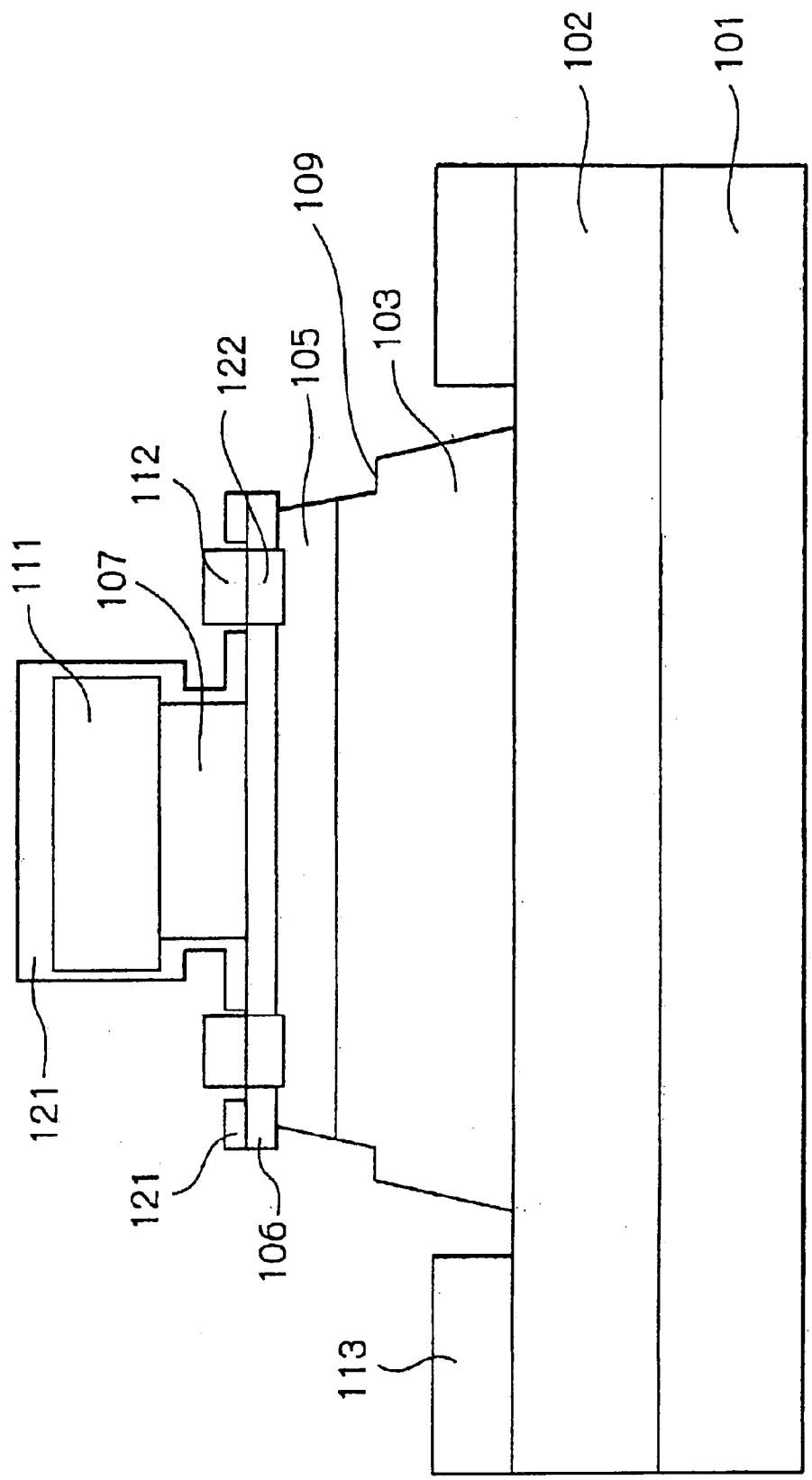

HETEROJUNCTION BIPOLAR TRANSISTOR AND METHOD OF PRODUCING THE SAME

CROSS REFERENCE TO RELATED APPLICATION:

This application is a Divisional of U.S. application Ser. No. 10/011,514, filed Dec. 3, 2001, now abandoned.

BACKGROUND OF THE INVENTION

1. Field of the Invention

The present invention relates to a reliable heretojunction bipolar transistor (HBT) and a method of producing the same.

2. Description of the Background Art

Prerequisites with an HBT are reducing capacitance between a base and a collector and lowering offset voltage for enhancing RF (Radio Frequency) performance. A decrease in capacitance between the base and the collector increases gain while a decrease in offset voltage reduces effective ON resistance to thereby increase power efficiency.

Another prerequisite is reducing the scatter of RF performance among HBTs. The accuracy of a junction area between the base and the collector is the key to low capacitance between the base and the collector, low offset voltage, and small scatter of RF performance. An accurate junction area is not achievable unless the amount of side etching of the base layer is controlled by promoting accurate processing of an emitter layer that over lies the base layer. While dry etching with high anisotropy is available for promoting accurate processing of the emitter layer, dry etching damages a device and deteriorates the characteristics and reliability of the device. It has therefore been customary to use isotropic dry etching or wet etching.

To reduce base recombination current, an HBT using GaAs has an emitter layer implemented as an InGaP layer. Photoresist or an oxide film has heretofore been used as a mask for processing an InGaP layer. Such a material used as a mask, however, cannot closely adhere to the InGaP emitter layer and causes the amount of side etching of the emitter layer to be scattered. To control the side etching of the InGaP emitter layer during processing of the base electrode, Japanese Patent Laid-Open Publication No. 2000-124226 uses an SiN film as a mask for processing InGaP. Even this kind of scheme fails to accurately lower offset voltage and capacitance between the base and the collector without any scatter.

Technologies relating to the present invention are also disclosed in, e.g., Japanese Patent Laid-Open Publication Nos. 5-136159 and 10-178021.

SUMMARY OF THE INVENTION

It is an object of the present invention to provide a reliable HBT capable of preventing a preselected function layer, particularly an emitter layer, from peeling off and a method of producing the same.

In accordance with the present invention, a method of producing an HBT uses a wafer including a substrate and a collector layer of a first conductivity type, a base layer of a second conductivity type and an emitter layer of the first conductivity type sequentially laminated on the substrate in this order. First, the wafer is etched up to a preselected depth of the collector layer via a first photoresist, which is formed at a preselected position on the emitter layer, serving as a mask. Subsequently, the collector layer is etched with at least the sidewalls of the base layer and collector layer, which are exposed by the first etching step, and a second photoresist covering part of the surface of the collector layer contiguous with the sidewalls serving as a mask.

Also, in accordance with the present invention, in an HBT produced from a wafer consisting of a substrate and a first collector layer of a first conductivity type, an etching stopper layer for preventing the first collector layer from being etched, a second collector layer of the first conductivity type, a base layer of a second conductivity type and an emitter layer of the first conductivity type sequentially laminated on the substrate in this order, a mesa step is formed between the sidewall of the first collector layer and the sidewall of the second collector layer with the etching stopper layer forming a boundary.

BRIEF DESCRIPTION OF THE DRAWINGS

The above and other objects, features and advantages of the present invention will become more apparent from the following detailed description taken with the accompanying drawings in which:

FIG. 2 is a section showing an HBT embodying the present invention;

DESCRIPTION OF THE PREFERRED EMBODIMENTS

Figure 1A:
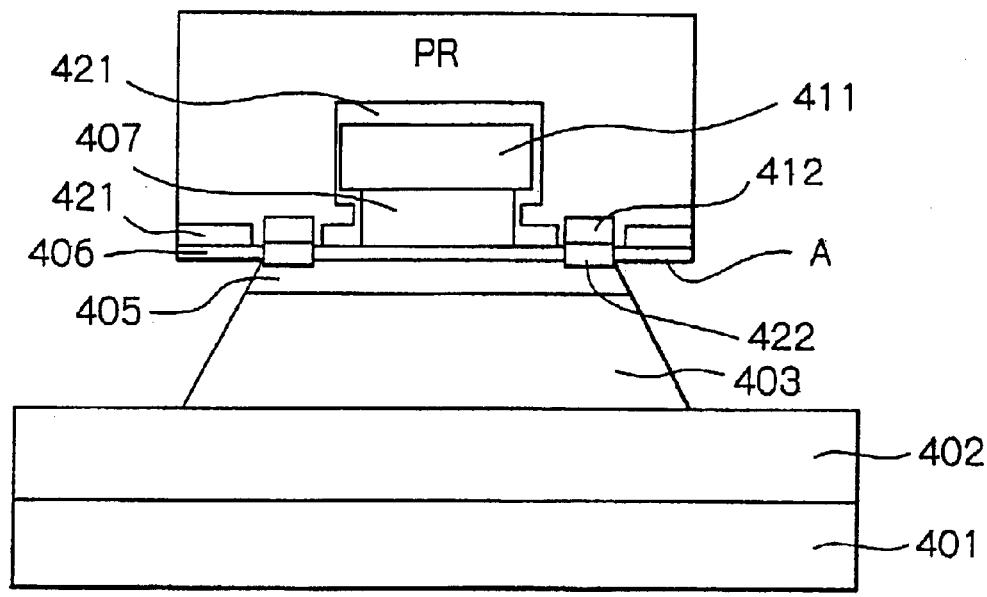
FIG. 1A is a section showing a conventional HBT with a penthouse.
Figure 1B:
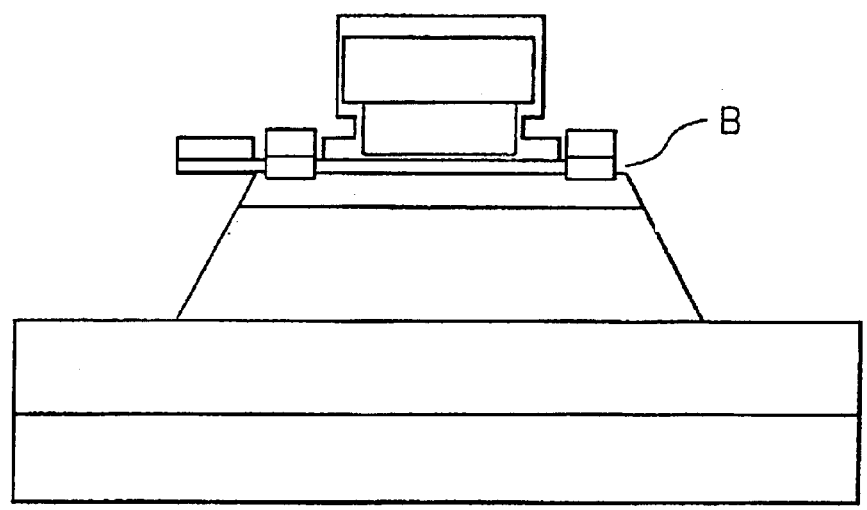
FIG. 1B is a section showing the conventional HBT with the penthouse peeled off.

To better understand the present invention, brief reference will be made to a conventional HBT, shown in FIGS. 1A and 1B. FIG. 1A shows a condition in which a penthouse is produced while FIG. 1B shows a condition in which the penthouse has peeled off. The technology taught in Laid-Open Publication No. 2000-124226 mentioned earlier promotes accurate processing of an InGaP layer and thereby improves control over the amount of side etching of the InGaP layer. However, as shown in FIG. 1A, the side of a base layer 405 and that of a collector layer 403 underlying an InGaP layer 406 are noticeably removed by the second side etching, causing the InGaP layer 406 to form a penthouse A. As shown in FIG. 1B, when the InGaP layer 406 is as thin as 100 nm or below, the penthouse A often peels off during processing, as indicated by a portion B. As a result, the surface of the base layer 405 is exposed and causes recombination current to increase thereon, degrading the reliability of the HBT.

The amount of side etching that causes the penthouse A to appear is effected mainly by the total thickness of the base layer 405 and collector layer 403; the thicker the base layer 405 and collector layer 403, the greater the scatter of the amount of side etching. Such a scatter, in turn, brings about a scatter of the junction area between the base layer 405 and the collector layer 403. This problem is more serious with a power device needing a high breakdown voltage. Specifically, a power device needs a collector layer as thick as, e.g., 400 nm or above.

There are also shown in FIG. 1A a semi insulative GaAs substrate 401, a subcollector layer 402, an emitter gap layer 407, an emitter electrode 411, a base electrode 412, an SiN film 421, an alloyed layer 422, and a photoresist PR.

Referring to FIG. 2, an HBT embodying the present invention will be described. As shown, the HBT is made up of a semi insulative GaAs substrate 101, a subcollector layer 102, a collector layer 103, a base layer 105, an emitter layer 106, an emitter cap layer 107, a mesa step 109, an emitter electrode 111, a base electrode 112, an SiN film 121, and an alloyed layer 122.

The semi insulative GaAs substrate 10 is formed of nondoped or Cr-doped GaAs and has low electric resistance. The subcollector layer 102 is an n+-type GaAs layer formed on the GaAs substrate 101. The collector layer 103 is an n+-type or a nondoped GaAs layer formed on the subcollector layer 102. The sidewall of the collector layer 103 has a mesa step 109. The base layer 105 is a p+-type GaAs layer formed on the collector layer 103. The sidewall of the base layer 105 underlies the emitter layer 106. The emitter layer 106 is an n-type InGaP layer formed in a preselected region on the base layer 105. The emitter cap layer 107 is an n-type GaAs or InGaAs layer formed in a preselected region on the emitter layer 106. The mesa step 109 is formed on the sidewall of the collector layer 103 and serves to reduce the size of the penthouse of the emitter layer 106.

The emitter electrode 111 is a WSi electrode formed on the emitter cap layer 107. The alloyed layer 122 is formed in a contact hole extending throughout the SiN film 121 and emitter layer 106, which are laminated on the base layer 105, and is implemented by Pt and InGaP and Pt and GaAs. The base electrode 112 is an electrode formed in a contact hole extending throughout the SiN film 121 and emitter layer 106 laminated on the alloyed layer 122. The SiN film 121 is a passivation film extending over a preselected region of the emitter layer 106, emitter cap layer 107 and emitter electrode 111. The collector electrode 113 is formed in a preselected region on the subcollector layer 102.

Figure 3A:
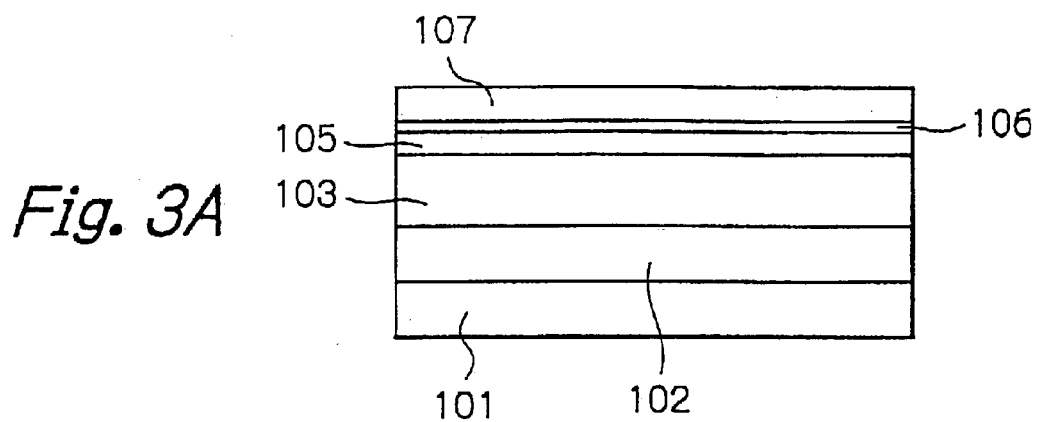
FIGS. 3A through 3H are sections showing a sequence of steps for producing the HBT of the illustrative embodiment.

Reference will be made to FIGS. 3A through 3H for describing a procedure for producing the HBT shown in FIG. 2. First, as shown in FIG. 3A, the subcollector layer 102 is formed on the semi insulative GaAs substrate 101. Subsequently, the collector layer 103, which may be 400 nm to 2,000 nm thick by way of example, is formed on the collector layer 103. The base layer 105, which may be 40 nm to 100 nm thick by way of example, is formed on the collector layer 103. The emitter layer 106, which may be 10 nm to 100 nm thick by way of example, is formed on the base layer 105. Thereafter, the emitter cap layer 107 is formed on the emitter layer 106, thereby completing a laminate epitaxial wafer.

Figure 3B:
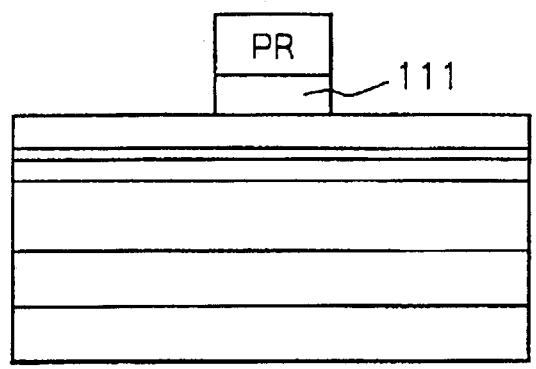
Figure 3C:
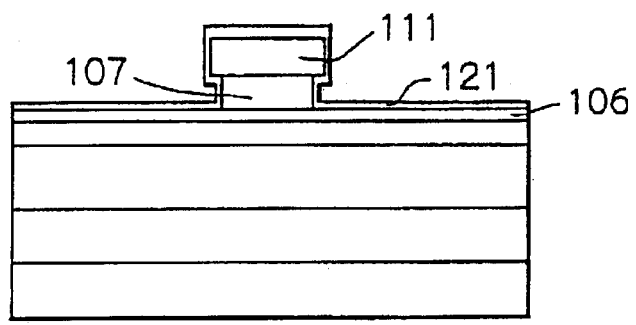
Figure 3D:
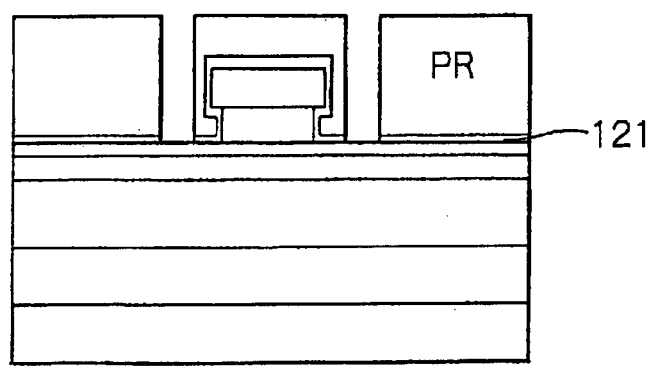

As shown in FIG. 3B, after Wsi has been sputtered over the entire surface of the epitaxial wafer, Wsi is etched with a photoresist (PR) serving as a mask to thereby form the emitter electrode 111. Subsequently, as shown in FIG. 3C, the emitter cap layer 107 is selectively etched out to the surface of the emitter layer 106 by a phosphoric or a sulfuric etchant with the emitter electrode 111 serving as a mask. As a result, the SiN film 121 is formed over the entire surface of the laminate to a thickness of, e.g., 10 nm to 200 nm. Thereafter, as shown in FIG. 3D, a PR mask is formed on the SiN film 121 for forming a hole at a preselected position. The SiN film 121 is partly etched out by a hydrofluoric etchant, so that the emitter layer 106 is partly exposed to the outside.

Figure 3E:
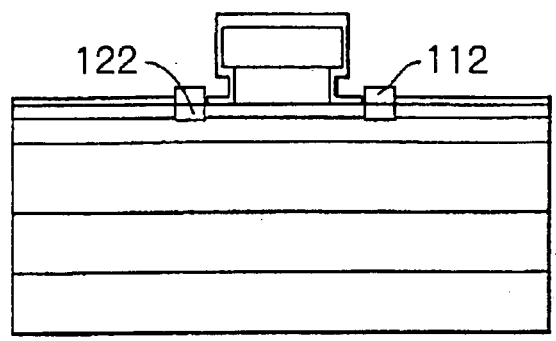

Subsequently, the PR mask shown in FIG. 3D is used to form the base electrode 112 by evaporation lift-off. For example, sintering using, e. g., Pt/Ti/Pt/Au is effected from above the emitter layer 106. As shown in FIG. 3E, the alloyed layer of Pt and InGaP and Pt and GaAs is formed by an alloying technology, electrically connecting the base layer 105 and base electrode 112.

A specific evaporation lift-off method is evaporating, e.g., Pt/Ti/Pt/Au inclusive of the PR mask and then lifting off the electrode material from excess portions together with the PR mask. Alloying may be effected at, e.g., 300° C. after the lift-off. This successfully enhances adhesion of the emitter layer 106 and electrode material to each other. Pt/Ti/Pt/Au is a non-alloy type ohmic electrode that insures reliable ohmic contact and implements an electrode pattern with high resolution.

Figure 3F:
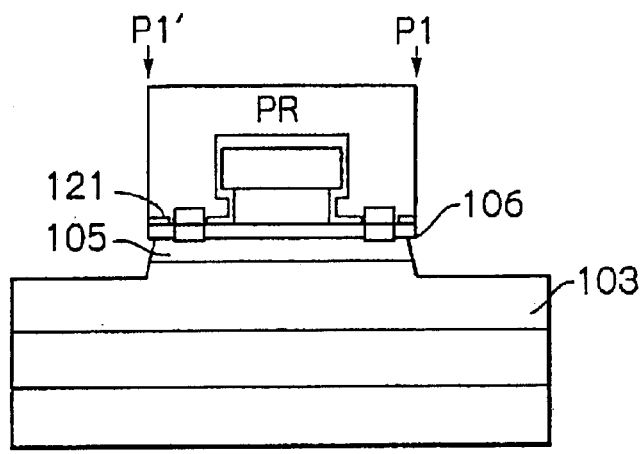

Subsequently, as shown in FIG. 3F, a first PR mask is formed over a preselected region P1–P1' on the base electrode 112 and SiN film 121. The SiN film 121 is then removed by a hydrofluoric etchant via the PR mask. This is followed by removing the emitter layer 106 by use of a hydrochloric etchant, then removing the base layer 105 by use of a sulfuric etchant, and then removing the collector layer 103 halfway by, e.g., 10 nm to 200 nm. At this instant, the amount of side etching of the base layer 105 and that of the collector layer 103 respectively correspond to the thickness by which the base layer 105 has been removed and the thickness by which the collector 103 has been removed. Therefore, the collector 103 should preferably be removed by a relatively small thickness in order to reduce the amount of side etching of the base layer 105 and that of the collector layer 103. This successfully reduces the size of the penthouse of the emitter layer 106.

Figure 3G:
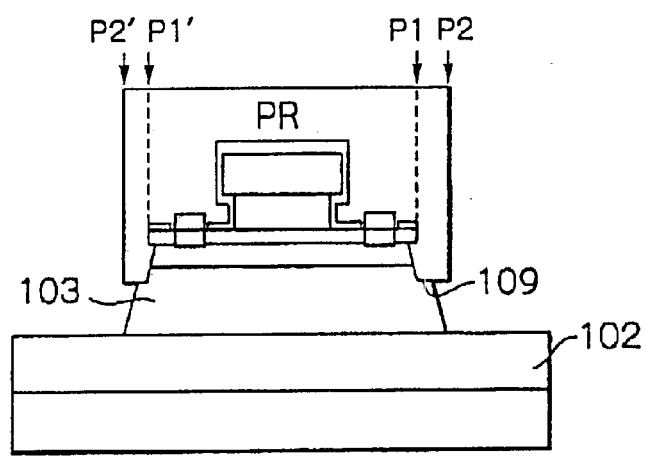

As shown in FIG. 3G, a second PR mask is formed over preselected regions P1'–P2', and P1–P2 on the base layer 105 and collector layer 103. The collector layer 103 is then removed to the surface of the subcollector layer 102 via the second PR mask by use of a phosphoric etchant or a sulfuric etchant. The second PR mask therefore preserves the sidewalls (first sidewalls) of the base layer 105 and collector layer 103 implemented by the first PR mask, so that the penthouse of the emitter layer 106 is prevented from increasing in size.

Further, the amount of side etching of the collector layer 103 underlying the second PR mask also corresponds to the thickness by which the collector layer 103 has been removed. It follows that the second PR mask covering the collector layer 103 should preferably extend over a certain width. More specifically, it is desirable to provide each of the regions P1' and P2' and P1–P2 with a certain width. This successfully controls the dimension of the second sidewall or lower sidewall of the collector layer 103 implemented by the second PR mask such that the second sidewall does not reach the first sidewall. Consequently, the mesa step 109 whose boundary is the bottom of the second PR mask is formed. If desired, the first and second sidewalls may be formed flush with each other, depending on the relation between the width of the region P1'–P2' and that of the region P1–P2 and the remaining thickness of the collector layer 103.

Figure 3H:
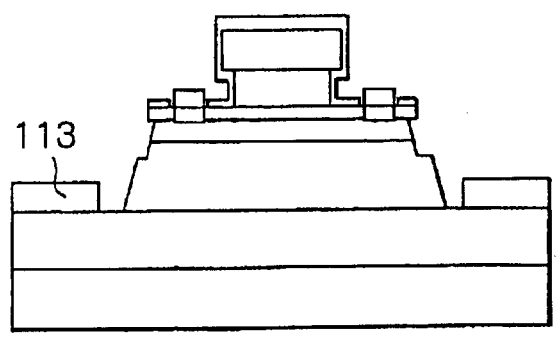

As shown in FIG. 3H, after the removal of the PR mask, the collector electrode 113 is formed by, e.g., AuGe/Ni/Au by using evaporation lift-off.

As stated above, the illustrative embodiment insures an accurate junction area between the base and the collector and thereby accurately reduces offset voltage and capacitance between the base and the collector without any scatter. Further, the illustrative embodiment obstructs the peeling of the InGaP emitter layer. These advantages are derived from the production procedure and structure unique to the illustrative embodiment, as will be described more specifically hereinafter.

The collector layer 103 is etched out halfway by 10 nm to 200 nm in order to form a mesa step, as described with reference to FIG. 3E. Subsequently, as shown in FIG. 3F, a PR mask different from a PR mask used in the step of FIG. 3E is used to remove the remaining collector layer 103. It has been customary to use only the first PR mask of FIG. 3E for removing an SiN film, an emitter layer, a base layer and a collector layer and thereby exposing a subcollector layer, as described with reference to FIG. 1A. This, however, causes the emitter layer to form a penthouse due to the side etching of the base layer and collector layer. The side etching is effected mainly by the thickness of the base layer and collector layer. By contrast, the illustrative embodiment removes the collector layer only by 10 nm to 200 nm and thereby reduces the amount of side etching. This is why the emitter layer does not form a penthouse and the junction area between the base and the collector is scattered little.

Moreover, the penthouse of the emitter layer is apt to come off during the process if the emitter layer is as thin as 100 nm or below, as shown in FIG. 1B. As a result, the surface of the base layer 105 is exposed with the result that recombination current on the base surface increases and degrades the reliability of the HBT. In the illustrative embodiment, the penthouse of the InGaP layer is small and peels off little, enhancing the reliability of the transistor.

Figure 4:
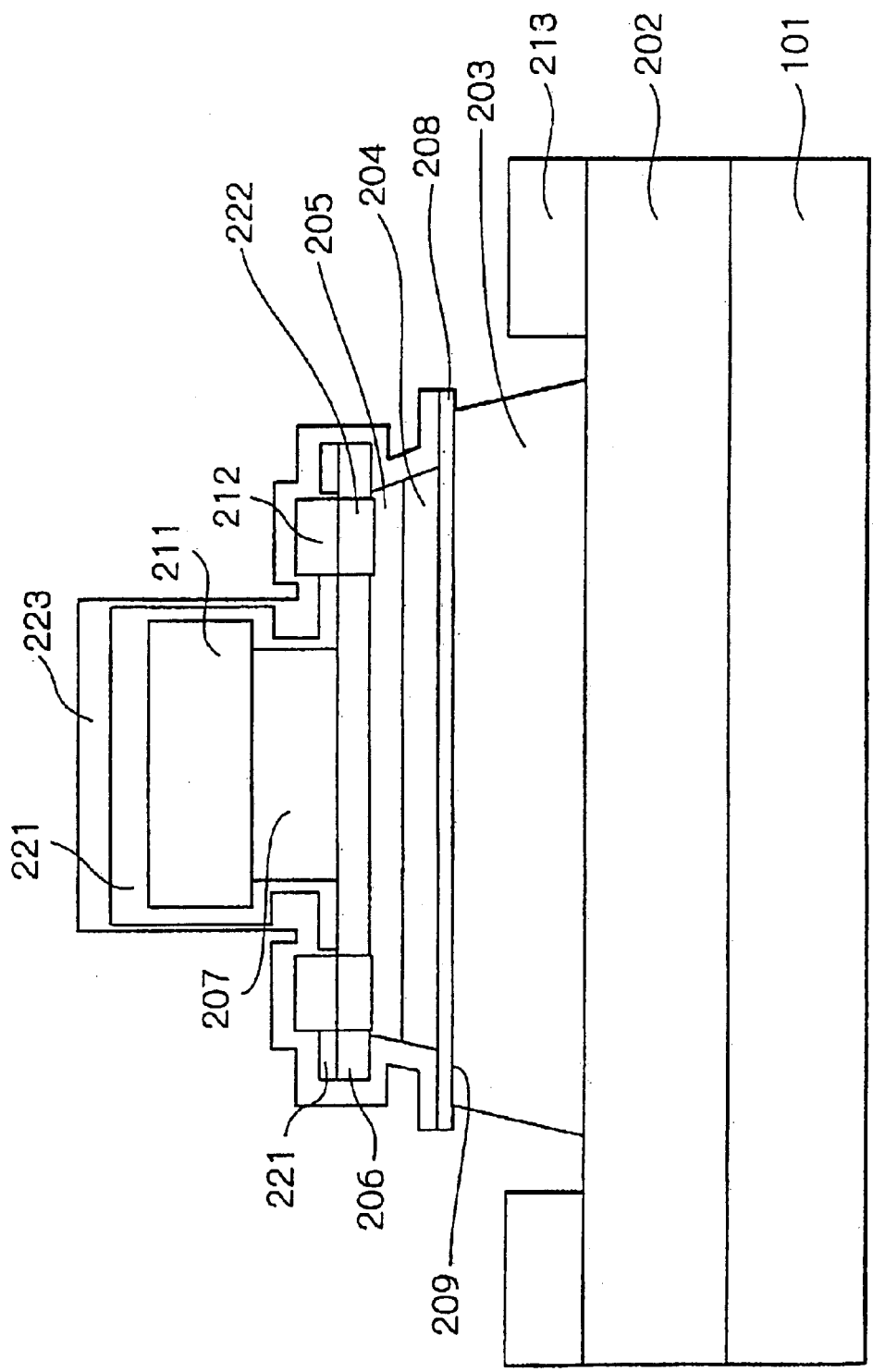
FIG. 4 is a section showing an alternative embodiment of the present invention.

An alternative embodiment of the present invention will be described with reference to FIG. 4. As shown, the illustrative embodiment, like the previous embodiment includes a semi insulative GaAs substrate 201, a subcollector layer 202, a base layer 205, an emitter layer 206, an emitter gap layer 207, a mesa step 209, an emitter electrode 221, a base electrode 212, a first SiN film 221, and an alloyed layer 222. The illustrative embodiment additionally includes a first collector layer 203, a second collector layer 204, an etching stopper layer 208, and a second SiN film 223.

The first collector layer 203 is an n-type or a nondoped GaAs layer formed on the subcollector layer 202. In the illustrative embodiment, the sidewall of the first collector layer 203 does not include a mesa step and is formed below the etching stopper layer 208. The second collector layer 204 is an n-type or a nondoped GaAs layer formed in a preselected region on the etching stopper layer 208. In the illustrative embodiment, the sidewall of the second collector layer 204 does not include a mesa step and is formed below the emitter layer 206 together with the sidewall of the base layer 205.

The etching stopper layer 208 is formed of InGaP and intervenes between the first and second collector layers 203 and 204. The edge of the etching stopper layer 208 protrudes from the sidewall of the first collector layer 203 and that of the second collector layer 204. The sidewall of the first collector layer 203 and that of the second collector layer 204 form a mesa step with the intermediary of the etching stopper layer 208. The second SiN film 223 is formed on the surfaces of the first SiN film 221, base electrode 212, emitter layer 206, base layer 205, second collector layer 204, and etching stopper layer 208. As for the rest of the structure, this embodiment is similar to the previous embodiment.

Figure 5A:
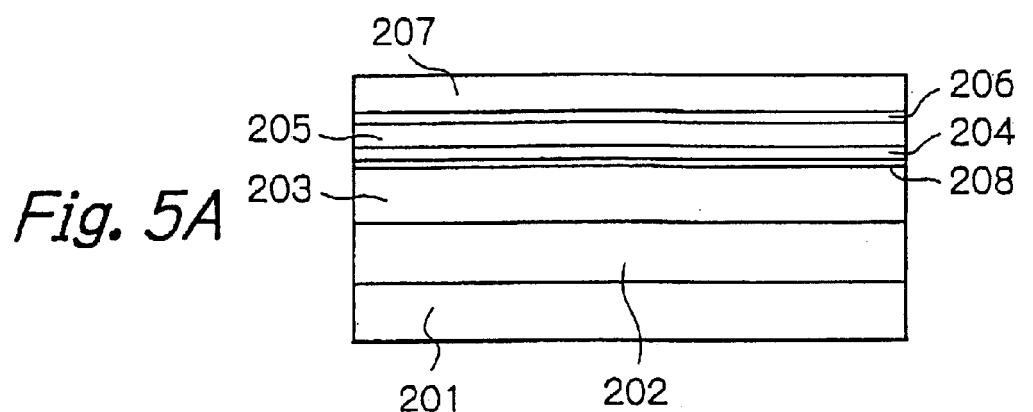
FIGS. 5A through 5H are sections showing a sequence of steps for producing the HBT of the alternative embodiment.

Reference will be made to FIGS. 5A through 5H for describing a procedure for producing the HBT of the illustrative embodiment. First, as shown in FIG. 5A, the subcollector layer 202 is formed on the semi insulative GaAs substrate 201. The first collector layer 203, which may be 400 nm to 2,000 nm thick by way of example, is formed on the subcollector layer 202. The etching stopper layer 208 is formed on the first collector layer 203. The second collector layer 204, which may be 10 nm to 200 nm thick, is formed on the etching stopper layer 208. The base layer 205, which may be 40 nm to 100 nm thick by way of example, is formed on the second collector layer 204. The emitter layer 206, which may be 10 nm to 100 nm thick by way of example, is formed on the base layer 205. The emitter cap layer 207 is formed on the emitter layer 206, completing a laminate epitaxial wafer.

Figure 5B:
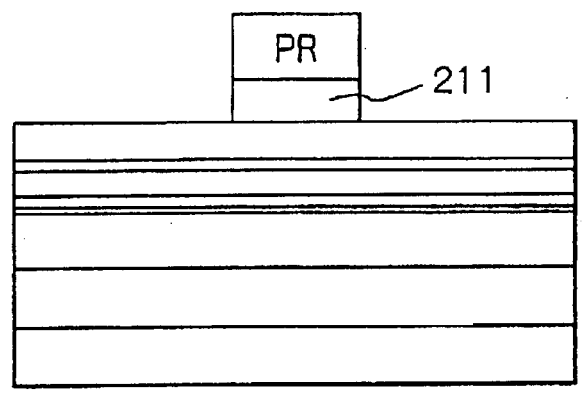

As shown in FIG. 5B, after WSi has been sputtered over the entire epitaxial wafer, WSi is etched via a PR mask to thereby form the emitter electrode 211.

Figure 5C:
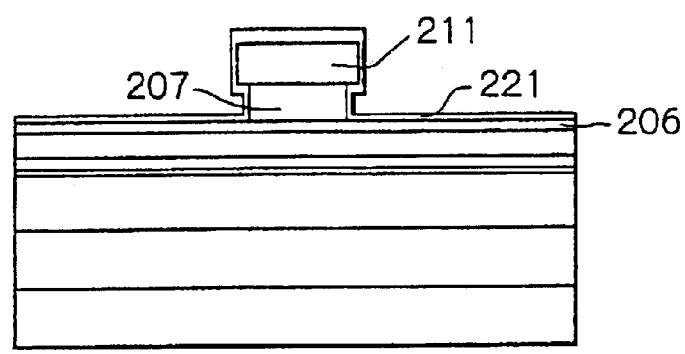

As shown in FIG. 5C, the emitter cap layer 207 is selectively etched to the surface of the emitter layer 206 by a phosphoric or a sulfuric etchant with the emitter mask 211 serving as a mask. The first SiN film 221 is then formed over the entire surface of the laminate with a thickness of 10 nm to 200 nm.

Figure 5D:
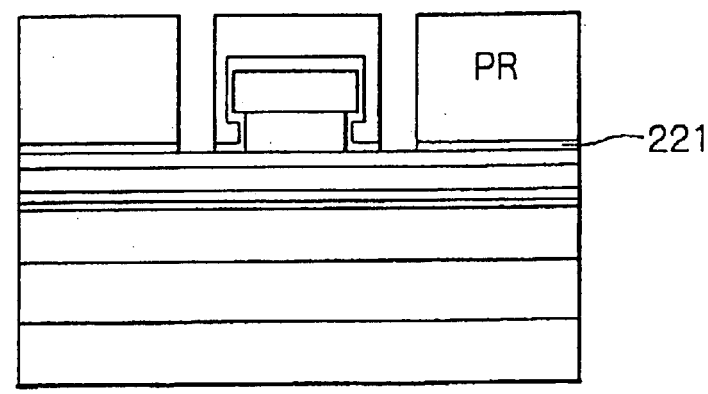
Figure 5E:
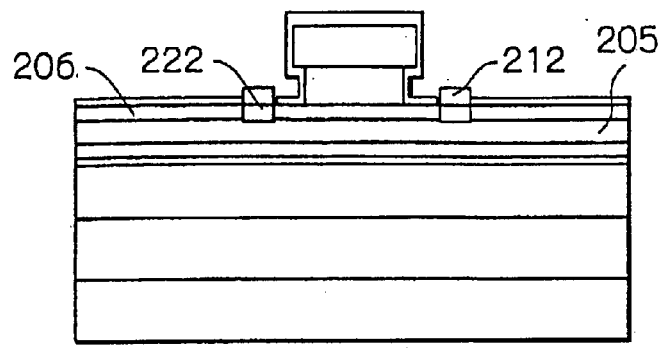

As shown in FIG. 5D, a PR mask is formed on the first SiN film 221 for forming a hole at a preselected position. The first SiN film 221 is then partly removed by a hydrofluoric etchant via the PR mask so as to expose part of the emitter electrode 206. Subsequently, the base electrode 212 is formed via the PR mask of FIG. 5D by using evaporation lift-off. For example, sintering is effected with Pt/Ti/Pt/Au from above the emitter layer 206. Thereafter, as shown in FIG. 5E, the alloy layer 222 of Pt and InGaP and Pt and GaAs is formed by an alloying technology, thereby electrically connecting the base layer 205 and base electrode 212.

Figure 5F:
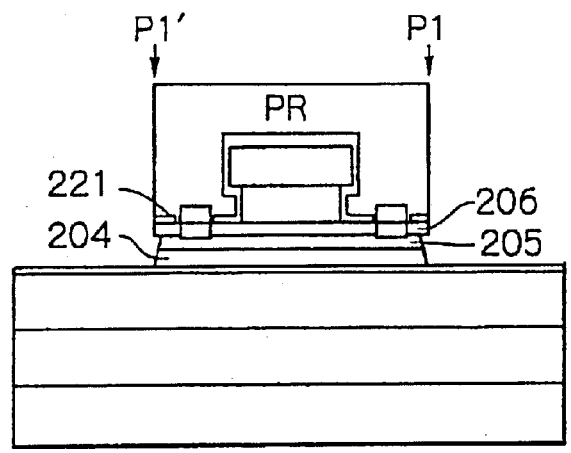

As shown in FIG. 5F, a PR mask is formed in a preselected region P1-P1' on the base electrode 212 and first SiN film 221. The SiN film 221 is then removed via the PR mask by using a hydrofluoric etchant. This is followed by removing the emitter layer 206 with a hydrochloric etchant, then removing the base layer 205 with a phosphoric or a sulfuric etchant, and then removing the second collector layer 204 to the surface of the etching stopper layer 208. At this instant, the amount of side etching of the base layer 205 and that of the second collector layer 204 respectively correspond to the thickness by which the base layer 205 has been removed and the thickness by which the collector layer 204 has been removed. Therefore, the second collector layer 204 should preferably be relatively thin in order to reduce the amount of side etching of the base layer 205 and that of the second collector layer 204. This desirably reduces the size of the penthouse of the emitter layer 206.

Figure 5G:
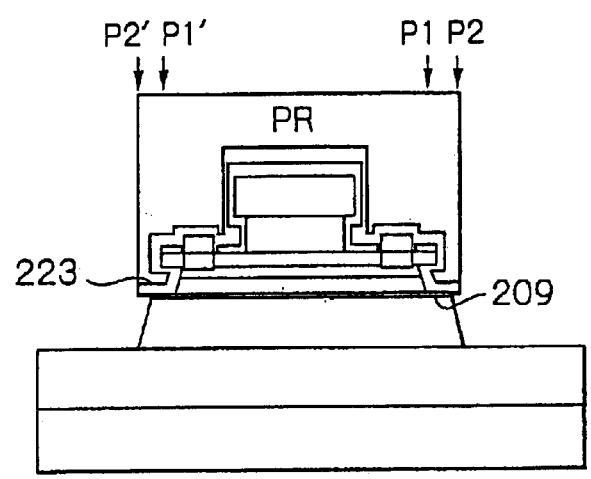

As shown in FIG. 5G, after the PR mask (first PR mask) has been removed, the second SiN film 223 is formed over the entire surface of the laminate. A second PR mask is then formed in a preselected region P2-P2', which is broader than the region P1-P1', on the second SiN film 23. Thereafter, needless part of the second SiN film 223 is removed via the second PR mask. This is followed by removing the etching stopper layer 208 with a hydrochloric etchant and then removing the first collector layer 203 to the surface of the subcollector layer 202. The second SiN film 223 and second PR mask preserve the sidewall of the base layer 205 and that of the second collector layer 204 implemented by the first PR mask, thereby preventing the penthouse of the emitter layer 206 from increasing in size.

Further, the amount of side etching of the first collector layer 203, which underlies the emitter layer 206, also corresponds to the thickness by which the first collector layer 203 has been removed. More specifically, the region P2–P2' should preferably have a certain width. In this condition, the sidewall (second sidewall) of the first collector layer 203 implemented by the second PR mask can be prevented from extending inward of the first sidewall. Consequently, the mesa step 209 whose boundary is the stopper layer 208 is formed. Again, the first and second sidewalls may be formed flush with each other, depending on the relation between the width of the region P2–P2' and the thickness of the first collector layer 203, if desired.

Figure 5H:
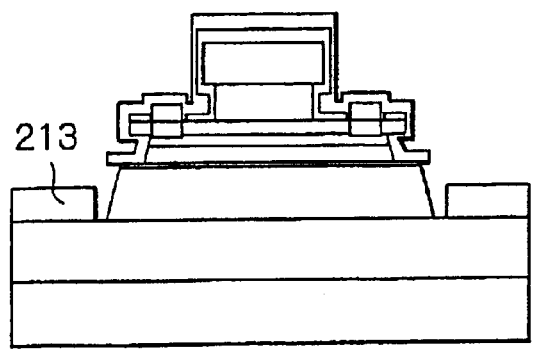

Finally, as shown in FIG. 5H, after the PR mask has been removed, the collector electrode 213 is formed by evaporation lift-off using, e.g., AuGe/Ni/Au.

Figure 6:
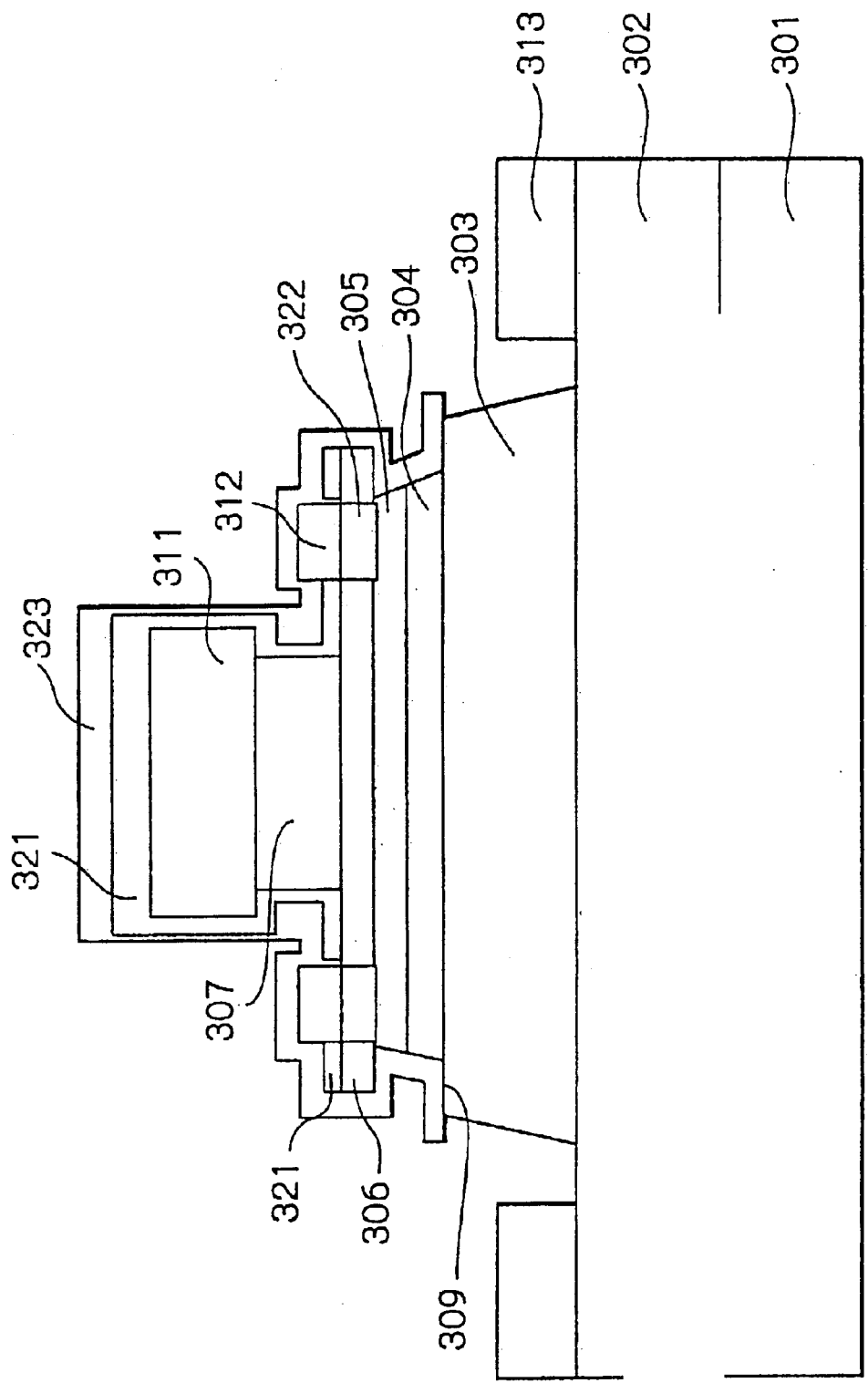
FIG. 6 is a section showing another alternative embodiment of the present invention.

Another alternative embodiment will be described with reference to FIG. 6. As shown, the HBT of the illustrative embodiment includes a semi insulative GaAs substrate 301, a subcollector layer 302, a base layer 305, an emitter layer 306, an emitter cap layer 307, a mesa step 309, an emitter electrode 311, a base electrode 312, a first SiN film 321, and an alloyed layer 322. This embodiment differs from the embodiment of FIG. 2 in that it additionally includes a first collector layer 303, a second collector layer 304 and a second SiN film 323 and differs from the embodiment of FIG. 4 in that it does not include an etching stopper layer. As for the rest of the structure, this embodiment is similar to the embodiment of FIG. 4.

Figure 7A:
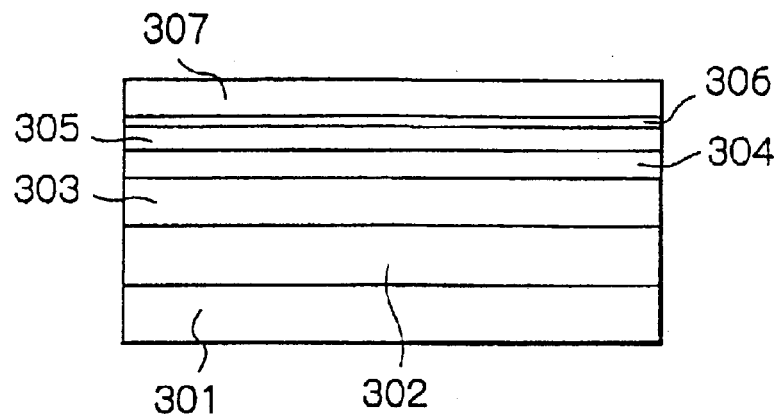
FIGS. 7A through 7H are sections showing a sequence of steps for producing the HBT of the embodiment shown in FIG. 6.

A procedure for producing the HBT of the illustrative embodiment will be described with reference to FIGS. 7A through 7H. First, as shown in FIG. 7A, the subcollector layer 302 is formed on the semi insulative GaAs substrate 301. The first collector layer 303, which may be 400 nm to 2,000 nm thick by way of example, is formed on the subcollector layer 302. The second collector layer 304, which may be 10 nm to 200 nm thick, is formed on the first collector layer 203. The base layer 305, which may be 40 nm to 100 nm thick by way of example, is formed on the second collector layer 304. The emitter layer 306, which may be 10 nm to 100 nm thick by way of example, is formed on the base layer 305. The emitter cap layer 307 is formed on the emitter layer 306, completing a laminate epitaxial wafer.

Figure 7B:
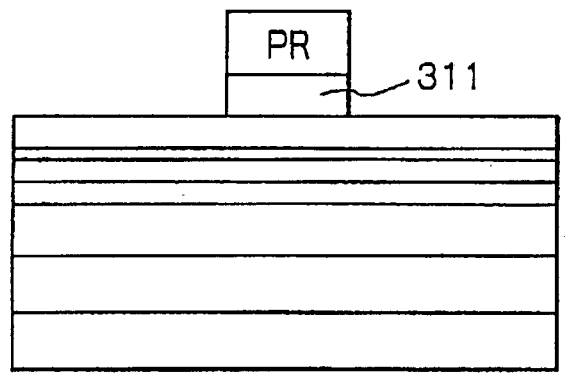

As shown in FIG. 7B, after WSi has been sputtered over the entire epitaxial wafer, WSi is etched via a PR mask to thereby form the emitter electrode 311.

Figure 7C:
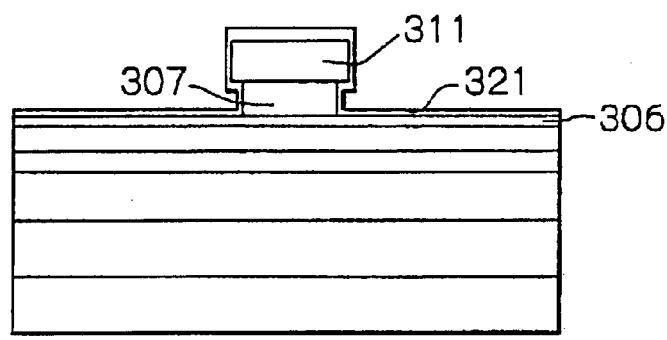

As shown in FIG. 7C, the emitter cap layer 307 is selectively etched to the surface of the emitter layer 306 by a phosphoric or a sulfuric etchant with the emitter mask 311 serving as a mask. The first SiN film 321 is then formed over the entire surface of the laminate with a thickness of 10 nm to 200 nm.

Figure 7D:
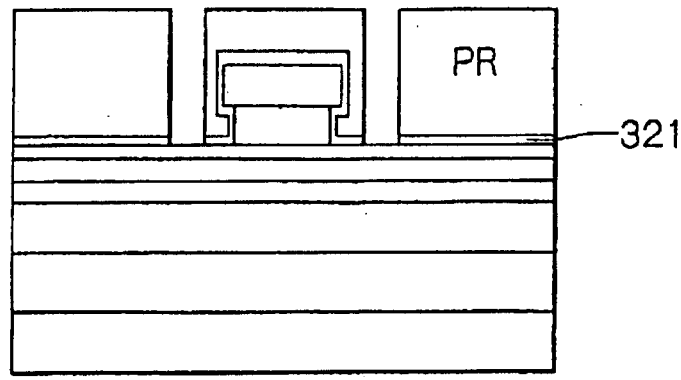
Figure 7E:
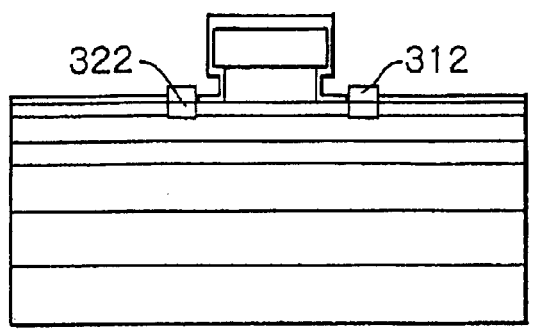

As shown in FIG. 7D, a PR mask is formed on the first SiN film 321 for forming a hole at a preselected position. The first SiN film 321 is then partly removed by a hydrofluoric etchant with the PR mask so as to expose part of the emitter electrode 306. Subsequently, the base electrode 312 is formed via the PR mask of FIG. 7D by using evaporation lift-off. For example, sintering is effected with Pt/Ti/Pt/Au from above the emitter layer 306. Thereafter, as shown in FIG. 7E, the alloy layer 322 of Pt and InGaP and Pt and GaAs is formed by an alloying technology, thereby electrically connecting the base layer 305 and base electrode 312.

Figure 7F:
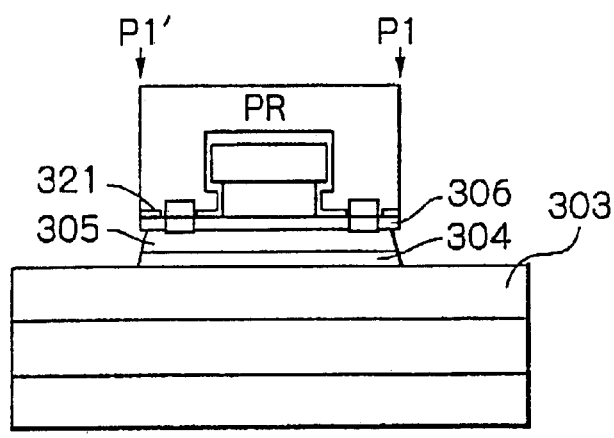

As shown in FIG. 7F, a PR mask is formed in a preselected region P1–P1' on the base electrode 312 and first SiN film 321. The SiN film 321 is then removed via the PR mask by using a hydrofluoric etchant. This is followed by removing the emitter layer 306 with a hydrochloric etchant, then removing the base layer 305 with a phosphoric or a sulfuric etchant, and then removing the second collector layer 304. At this instant, the amount of side etching of the base layer 305 and that of the second collector layer 304 respectively correspond to the thickness by which the base layer 305 has been removed and the thickness by which the collector layer 304 has been removed. Therefore, the second collector layer 304 should preferably be relatively thin in order to reduce the amount of side etching of the base layer 305 and that of the second collector layer 304. This desirably reduces the size of the penthouse of the emitter layer 306.

Figure 7G:
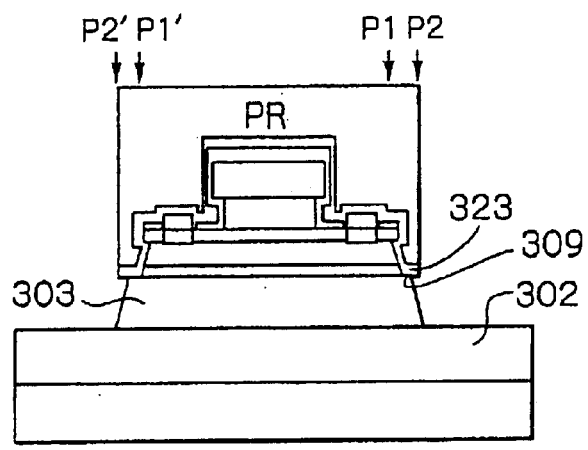

As shown in FIG. 7G, after the PR mask has been removed, the second SiN film 323 is formed over the entire surface of the laminate. A PR mask is then formed in a preselected region P2–P2' on the second SiN film 323. Thereafter, the excess part of the second SiN film 323 is removed via the above PR mask. This is followed by removing the first collector layer 303 to the surface of the subcollector layer 302 with a phosphoric or a sulfuric etchant. The second SiN film 323 and second PR mask preserve the sidewall of the base layer 305 and that of the second collector layer 304 implemented by the first PR mask, thereby preventing the penthouse of the emitter layer 306 from increasing in size.

Further, the amount of side etching of the first collector layer 303, which underlies the emitter layer 306, also corresponds to the thickness by which the first collector layer 303 has been removed. More specifically, the region P2–P2' should preferably have a certain width. In this condition, the sidewall (second sidewall) of the first collector layer 303 implemented by the second PR mask can be prevented from extending inward of the first sidewall. Consequently, the mesa step 309 whose boundary is the interface between the first and second collector layers 303 and 304 is formed. Again, the first and second sidewalls may be formed flush with each other, depending on the relation between the width of the region P2–P2' and the thickness of the first collector layer 303, if desired.

Figure 7H:
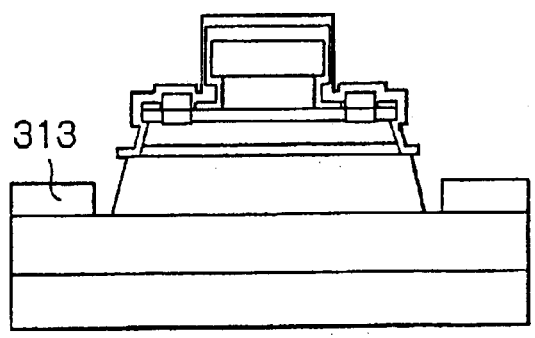

Finally, as shown in FIG. 7H, after the PR mask has been removed, the collector electrode 313 is formed by evaporation lift-off using, e.g., AuGe/Ni/Au.

It is to be noted that the present invention is applicable not only to an HBT but also to other various kinds of transistors. In any case, the present invention reduces the size of a penthouse protruding from, e.g., a collector layer sideways outward of the sidewall of an underlying layer.

In summary, it will be seen that the present invention provides an HBT having an accurate junction area between a base and a collector and thereby accurately reducing offset voltage and capacitance between the base and the collector without any scatter. Further, the HBT of the present invention is reliable because it obstructs the peeling of an InGaP emitter layer and thereby prevents the surface of a base layer from being exposed.

Various modifications will become possible for those skilled in the art after receiving the teachings of the present disclosure without departing from the scope thereof.

What is claimed is:

1. A method of producing a heterojunction bipolar transistor (HBT) from a wafer consisting of a substrate and a collector layer of a first conductivity type, a base layer of a second conductivity type and an emitter layer of said first conductivity type sequentially laminated on said substrate in this order, said method comprising:
- a first etching step of etching said wafer up to a preselected depth of said collector layer by using a first photoresist, which is formed at a preselected position on said emitter layer, as a mask; and
- a second etching step of etching said collector layer by using a second photoresist covering at least a sidewall of said base layer and a sidewall of said collector layer exposed by said first etching step and a part of a surface of said collector layer contiguous with the sidewalls as a mask;
- a step of removing, before forming said second photoresist, said first photoresist and then forming an SiN film on said substrate; and
- a step of removing, after forming said second photoresist, said SiN film exposed.

2. The method as claimed in claim 1, further comprising:
- a step of forming, before forming said first photoresist, an SiN film on said substrate; and
- removing, after forming said first photoresist, said SiN film exposed.

3. The method as claimed in claim 2, further comprising:
- a step of removing, before forming said second photoresist, said first photoresist and then forming an SiN film on said substrate; and
- a step of removing, after forming said second photoresist, said SiN film exposed.

4. The method as claimed in claim 1, further comprising a step of forming at a preselected position on said emitter layer a base electrode extending throughout said emitter layer to be thereby electrically connected to said base layer.

5. The method as claimed in claim 4, further comprising:
- a step of removing, before forming said second photoresist, said first photoresist and then forming an SiN film on said substrate; and
- a step of removing, after forming said second photoresist, said SiN film exposed.

6. The method as claimed in claim 4, further comprising:
- a step of forming, before forming said first photoresist, an SiN film on said substrate; and
- removing, after forming said first photoresist, said SiN film exposed.

7. The method as claimed in claim 6, further comprising:
- a step of removing, before forming said second photoresist, said first photoresist and then forming an SiN film on said substrate; and
- a step of removing, after forming said second photoresist, said SiN film exposed.

8. A method of producing an HBT from a wafer consisting of a substrate and a first collector layer of a first conductivity type, an etching stopper layer for preventing said first collector layer from being etched, a second collector layer of said first conductivity type, a base layer of a second conductivity type and an emitter layer of of said first conductivity type sequentially laminated on said substrate in this order, said method comprising:
- a first etching step of etching said wafer to a depth where said etching stopper layer is exposed by using a first photoresist formed at a preselected position on said emitter layer as a mask; and
- a second etching step of etching said etching stopper layer and said first collector layer, which are exposed, by using a second photoresist covering at least a sidewall of said base layer and a sidewall of said second collector layer and a part of a surface of said etching stopper layer contiguous with the sidewalls as a mask.

9. The method as claimed in claim 8, further comprising:
- a step of removing, before forming said second photoresist, said first photoresist and then forming an SiN film on said substrate; and
- a step of removing, after forming said second photoresist, and SiN film exposed.

10. The method as claimed in claim 8, further comprising:
- a step of forming, before forming said first photoresist, an SiN film on said substrate; and
- removing, after forming said first photoresist, said SiN film exposed.

11. The method as claimed in claim 10, further comprising:
- a step of removing, before forming said second photoresist, said first photoresist and then forming an SiN film on said substrate; and
- a step of removing, after forming said second photoresist, said SiN film exposed.

12. The method as claimed in claim 8, further comprising a step of forming at a preselected position on said emitter layer a base electrode extending throughout said emitter layer to be thereby electrically connected to said base layer.

13. The method as claimed in claim 12, further comprising:
- a step of removing, before forming said second photoresist, said first photoresist and then forming an SiN film on said substrate; and
- a step of removing, after forming said second photoresist, said SiN film exposed.

14. The method as claimed in claim 12, further comprising:
- a step of forming, before forming said first photoresist, an SiN film on said substrate; and
- removing, after forming said first photoresist, said SiN film exposed.

15. The method as claimed in claim 14, further comprising:
- a step of removing, before forming said second photoresist, said first photoresist and then forming an SiN film on said substrate; and
- a step of removing, after forming said second photoresist, said SiN film exposed.

16. A method of producing an HBT from a wafer consisting of a substrate and a first collector layer of a first conductivity type, a second collector layer of said first conductivity type, a base layer of a second conductivity type and an emitter layer of said first conductivity type sequentially laminated on said substrate in this order, said method comprising:
- a first etching step of etching said wafer to a depth where said first collector layer is exposed by using a first photoresist formed at a preselected position on said emitter layer as a mask; and
- a second etching step of etching said first collector layer, which is exposed, by using a second photoresist covering at least a sidewall of said base layer and a sidewall of said second collector layer and a part of a surface of said first collector layer contiguous with the sidewalls as a mask.

17. The method as claimed in claim 16, further comprising:
   a step of removing, before forming said second photoresist, said first photoresist and then forming an SiN film on said substrate; and
   a step of removing, after forming said second photoresist, said SiN film exposed.

18. The method as claimed in claim 16, further comprising:
   a step of forming, before forming said first photoresist, an SiN film on said substrate; and
   removing, after forming said first photoresist, said SiN film exposed.

19. The method as claimed in claim 18, further comprising:
   a step of removing, before forming said second photoresist, said first photoresist and then forming an SiN film on said substrate; and
   a step of removing, after forming said second photoresist, said SiN film exposed.

20. The method as claimed in claim 16, further comprising a step of forming at a preselected position on said emitter layer a base electrode extending throughout said emitter layer to be thereby electrically connected to said base layer.

21. The method as claimed in claim 20, further comprising:
   a step of removing, before forming said second photoresist, said first photoresist and then forming an SiN film on said substrate; and
   a step of removing, after forming said second photoresist, said SiN film exposed.

22. The method as claimed in claim 20, further comprising:
   a step of forming, before forming said first photoresist, an SiN film on said substrate; and
   removing, after forming said first photoresist, said SiN film exposed.

23. The method as claimed in claim 22, further comprising:
   a step of removing, before forming said second photoresist, said first photoresist and then forming an SiN film on said substrate; and
   a step of removing, after forming said second photoresist, said SiN film exposed.

24. A method of producing a transistor from a wafer consisting of a substrate and a first function layer, a second function layer and a third function layer sequentially laminated on said substrate in this order, said method comprising:
   a first etching step of etching said wafer up to a preselected depth of said first function layer by using a first photoresist formed at a preselected position on said third function layer as a mask; and
   a second etching step of etching said first function layer, which is exposed, by using a second photoresist covering at least a sidewall of said second function layer and a sidewall of said first function layer, which are exposed by said first etching step, and a part of a surface of said first function layer contiguous with the sidewalls as a mask;
   a step of removing, before forming said second photoresist, said first photoresist and then forming an SiN film on said substrate; and
   a step of removing, after forming said second photoresist, said SiN film exposed.

* * * * *